United States Patent
Liu

(10) Patent No.: US 12,125,958 B2
(45) Date of Patent: Oct. 22, 2024

(54) LED PACKAGE

(71) Applicant: BARCO N.V., Kortrijk (BE)

(72) Inventor: Chien Chih Liu, Tainan (TW)

(73) Assignee: BARCO N.V., Kortrijk (BE)

( * ) Notice: Subject to any disclaimer, the term of this patent is extended or adjusted under 35 U.S.C. 154(b) by 633 days.

(21) Appl. No.: 17/286,507

(22) PCT Filed: Oct. 28, 2019

(86) PCT No.: PCT/EP2019/079390
§ 371 (c)(1),
(2) Date: Apr. 19, 2021

(87) PCT Pub. No.: WO2020/084165
PCT Pub. Date: Apr. 30, 2020

(65) Prior Publication Data
US 2021/0343915 A1    Nov. 4, 2021

(30) Foreign Application Priority Data

Oct. 26, 2018 (GB) ..................... 1817483

(51) Int. Cl.
H01L 29/22    (2006.01)
H01L 33/48    (2010.01)
H01L 33/56    (2010.01)
H01L 33/62    (2010.01)

(52) U.S. Cl.
CPC ............ *H01L 33/62* (2013.01); *H01L 33/486* (2013.01); *H01L 33/56* (2013.01); *H01L 2933/005* (2013.01); *H01L 2933/0066* (2013.01)

(58) Field of Classification Search
CPC .. H01L 33/52; H01L 33/486; H01L 2933/005
USPC ................................ 438/25, 29; 257/99–100
See application file for complete search history.

(56) References Cited

U.S. PATENT DOCUMENTS

| 4,506,443 A | 3/1985 | Itoh |
| 6,621,616 B1 * | 9/2003 | Bauer ................... G01J 1/0204 |
| | | 257/E31.118 |
| 8,847,267 B2 | 9/2014 | Kim et al. |
| 2002/0064032 A1 | 5/2002 | Oohata |

(Continued)

FOREIGN PATENT DOCUMENTS

| CN | 102339925 A | 2/2012 |
| DE | 102009032606 A1 | 1/2011 |
| WO | 2017155282 A1 | 9/2017 |

OTHER PUBLICATIONS

Office Action issued in Chinese Application No. 201980070616.7, dated Oct. 26, 2023, with machine translation.

(Continued)

*Primary Examiner* — Nitin Parekh
(74) *Attorney, Agent, or Firm* — HSML P. C.

(57) ABSTRACT

A solid state die such as an LED (or OLED) die that is fitted in a hole such as a through hole in a carrier substrate such as a PCB. The die is to be connected to the PCB e.g. to tracks on the PCB. The electrical contacts on the die are arranged to be (e.g. substantially) in the same plane as the contacts on the carrier substrate such as the PCB. This is achieved by the holes in the substrate such as the PCB being adapted so that the dies fit into the holes or openings, i.e. are each taken up into an opening before electrical contacts are made.

20 Claims, 15 Drawing Sheets

(56) References Cited

U.S. PATENT DOCUMENTS

| | | | | |
|---|---|---|---|---|
| 2004/0038442 | A1* | 2/2004 | Kinsman | H01L 27/14618 |
| | | | | 257/E31.117 |
| 2007/0178629 | A1* | 8/2007 | Ogawa | H01L 24/97 |
| | | | | 257/E33.059 |
| 2007/0272938 | A1* | 11/2007 | Maeda | H01L 33/486 |
| | | | | 257/E33.072 |
| 2008/0122120 | A1 | 5/2008 | Itoh et al. | |
| 2010/0006888 | A1* | 1/2010 | Watanabe | H01L 33/486 |
| | | | | 257/E33.062 |
| 2013/0107178 | A1* | 5/2013 | Chiang | G02F 1/133509 |
| | | | | 349/104 |
| 2014/0011309 | A1 | 1/2014 | Lechleiter et al. | |
| 2015/0001563 | A1* | 1/2015 | Miki | H01L 33/54 |
| | | | | 257/98 |
| 2015/0050760 | A1* | 2/2015 | Imazu | H01L 24/96 |
| | | | | 438/27 |

OTHER PUBLICATIONS

ISR and Written Opinion in corresponding PCT Application No. PCT/EP2019/079390 dated Jan. 20, 2020.
International Preliminary Report on Patentability in corresponding PCT Application No. PCT/EP2019/079390 dated May 6, 2021.
Office Action issued in Chinese Application No. 201980070616.7, dated Aug. 15, 2024, with English translation of Search.

* cited by examiner

LED PACKAGE

The present invention relates to packaging of solid state light sources such as LED's or OLED's, or methods of manufacturing or repairing these.

BACKGROUND ART

The first PCBs used through hole technology which involves mounting electronic components by signal carrying leads being inserted through holes on one side of the board whereby only one lead passes through each hole. The leads are soldered onto copper traces.

Through hole technology adds the costs by requiring many holes to be drilled and it limits the available routing area for signal traces on layers immediately below the top layer on multi-layer boards. This is because the holes must pass through all layers of the PCB. Once surface-mounting became available, small-sized SMD components were used where possible, with through hole mounting only of components unsuitably large for surface-mounting due to power requirements or mechanical limitations.

Various methods such as die bonding can be used to fix light emitting diodes with packaging materials. For example, FIG. 1 illustrates how a LED can be electrically contacted to a substrate by mean of bumps as described in U.S. Pat. No. 8,847,267 "Light emitting diode with metal piles and multi-passivation layers and its manufacturing method". The numerals used in FIG. 1 are explained as follows:
- 100: a substrate,
- 110: a first semiconductor layer
- 120: an active layer,
- 130: a second semiconductor layer
- 140: a reflector layer,
- 150: a first electrode
- 160: a second electrode, A problem with this type of assembly is that there can be poor adhesion between the naked die and the bump or contact pads on the substrate. In LED arrays where large numbers of LEDs are assembled side by side, the probability that there will be a problem with at least one LED increases beyond what can be deemed acceptable.

The art needs improvement.

SUMMARY OF THE INVENTION

Embodiments of the present invention relate to packaging of solid state light sources such as LED's or OLED's, or methods of manufacturing or repairing these.

In embodiments of the present invention a light emitting die such as a solid state light emitting die is connected to a carrier substrate such as a PCB, the light emitting die having a light emitting element and being located in a hole or opening made in the carrier substrate, the carrier substrate having a first major surface or side and a second major surface or side. The first major surface or side and the second major surface or side are typically planar, i.e. each being in the form of a first and second plane respectively.

The light emitting die has a third major surface or side and a fourth major surface or side, the light emitting element being positioned on the third major surface. The third major surface or side and the fourth major surface or side are typically planar, i.e. each being in the form of a third and fourth plane respectively.

The light emitting dies can be solid state light sources such as LED's or OLED's.

Contact elements, e.g. a first and a second contact elements, are preferably positioned in or on the fourth major surface of the light emitting die. The contact elements, e.g. the first and second contact elements are electrically connected to an anode and a cathode of the light emitting element. The contacts e.g. the first and second contact elements in or on the fourth major surface of the light emitting die are electrically connected to second contacts, e.g. third and fourth contacts on the second major surface of the carrier substrate by means of any suitable a connection. The inclusion of the die into a hole in a carrier substrate such as a PCB allows a better connection between tracks on the substrate and the die.

The anode and cathode are signal conductors. At least two or more signal conductors (e.g. anode and cathode) from a solid state light source such as an LED or OLED die are provided per hole or opening in the carrier substrate. This reduces the number of holes required by 50% compared to conventional through hole technology.

The light emitting naked die can be encapsulated on the carrier substrate such as a PCB. The light emitting naked die can be encapsulated by an encapsulant such as silicone or silicone based glue. Access can be obtained to the die without disturbing the encapsulation.

At least two or more signal conductors from a solid state light source such as an LED or OLED die are provided per hole or opening in the carrier substrate. This reduces the number of holes required by 50% compared to conventional through hole technology.

An enclosure can enclose the hole or opening, e.g. on four sides thereof, while leaving space for die.

The method can include attaching a layer to the carrier substrate, the enclosure being formed in the layer.

The hole in the substrate can be a through hole. Through holes are easier to manufacture.

The carrier substrate can be flexible. This allows more types and shapes of installations.

The connection can be a connector and can comprises conductive adhesive beads. These are easier to manufacture.

The fourth major surface of the light emitting die and the second major surface of the carrier substrate can be substantially flush or co-planar. This makes forming connections between the die and the substrate as well as repairing or replacing a die easier.

An offset (OFF) may be provided (i.e. tolerated) between the fourth major surface and the second main surface. This offset OFF is preferably smaller than the thickness of the carrier substrate, preferably less than 30%, more preferably less than 10% of the thickness of the carrier substrate. The offset for example, can be at most 30% or more preferably at most 10%. In these case the offset has little effect. For example the offset can be at most 30 micron or more preferably at most 10 micron. For example the carrier substrate may be a PCB which may have a thickness between 0.1 and 10 mm.

The back side of the carrier substrate such as a PCB where the contacts are made is preferably covered by an isolation layer, such as an insulating adhesive tape applied to the back side. Alternatively, an insulating coating such as a varnish can be applied, e.g. by spraying.

Embodiments of the present invention provide a method of repairing the light emitting die connected to a carrier substrate as described above. If any of the contacts on the fourth major surface of the light emitting die which are electrically connected to contacts on the second major surface of the carrier substrate are damaged, the damaged connection can be repaired without having to remove the encapsulating material.

The light emitting die can have a light emitting element. The light emitting element can be a solid state light source such as an LED or OLED.

The method can comprise:

locating the light emitting die in a hole or opening made in a carrier substrate, whereby the carrier substrate has a first major surface or side and a second major surface or side, and the light emitting die has a third major surface or side and a fourth major surface or side. The method comprises positioning the light emitting element on the third major surface, positioning contact elements in or on the fourth major surface of the light emitting die, electrically connecting the contact elements to an anode and a cathode of the light emitting element, and electrically connecting the contacts on the fourth major surface of the light emitting die to contacts on the second major surface of the carrier substrate.

The method can include encapsulating the light emitting die on the carrier substrate, wherein the encapsulant can be silicone or silicone based glue.

The hole can be formed as a through hole.

At least two or more signal conductors from a solid state light source such as an LED or OLED die are provided per hole or opening in the carrier substrate. This reduces the number of holes required by 50% compared to conventional through hole technology.

The carrier substrate can be a printed circuit board.

The carrier substrate can be flexible.

The electrical connecting step can comprise using conductive adhesive beads.

The fourth major surface of the light emitting die and the second major surface of the carrier substrate can be arranged to be substantially flush or co-planar.

An offset (OFF) may be provided (i.e. tolerated) between the fourth major surface and the second main surface. This offset OFF is preferably smaller than the thickness of the carrier substrate, preferably less than 30%, more preferably less than 10% of the thickness of the carrier substrate. The offset for example, can be at most 30% or more preferably at most 10%. In these case the offset has little effect. For example the offset can be at most 30 micron or more preferably at most 10 micron. For example the carrier substrate may be a PCB which may have a thickness between 0.1 and 10 mm.

The method can include forming an enclosure which encloses the hole completely e.g. on four sides thereof, while leaving space for one die.

The method can include attaching a layer to the carrier substrate, the enclosure being formed in the layer.

The step of locating the light emitting die in a hole or opening can comprise attaching the light emitting die to a foil or sheet and inserting the light emitting die in the carrier substrate using the foil or sheet. The method can also comprise removing the foil or sheet to expose the first and/or the second electrical contacts.

The enclosure can be formed self-aligning with the hole or opening. Hence, enclosures on the carrier substrate and holes in the carrier substrate can be formed in a self-aligning manner. Each chip can be introduced into a through hole or opening of the carrier substrate. Contact pads can also be applied in an aligned manner.

In another aspect the present invention provides a kit of parts comprising:

A plurality of light emitting dies attached to a foil, and a carrier substrate, the light emitting dies having light emitting elements, the carrier substrate having periodically distanced holes or openings, each of the plurality of light emitting dies being aligned with the holes or openings.

In accordance with an aspect of the present invention, as described above, a solid state light source such an LED (or OLED) die fits in a hole such as a through hole in a substrate such as a PCB to which the die will be connected. An advantage of embodiments of the present invention is that the contact on a naked die will be (e.g. substantially) in the same plane as the contact on the substrate e.g. PCB. This is achieved by the holes in the substrate such as the PCB being adapted so that the naked dies fit into the openings, i.e. are each taken up into an opening.

Contact of the die to the carrier substrate such as the PCB is made laterally (i.e. in the x and Y plane), not vertically (i.e. in the z plane). The spacing of the dies in the x plane along the x direction i.e. $\Delta x$ is much greater than any offset in the z direction i.e. $\Delta z$. An offset (OFF) between the fourth major surface and the second main surface can be tolerated if it is small. This offset is preferably smaller than the thickness of the carrier substrate, preferably less than 30%, more preferably less than 10% of the thickness of the carrier substrate. The offset for example, can be at most 30% or more preferably at most 10%. In these case the offset has little effect. For example the offset can be at most 30 micron or more preferably at most 10 micron. For example the carrier substrate may be a PCB which may have a thickness between 0.1 and 10 mm.

An advantage of embodiments of the present invention is that a problem(s) of improved adhesion is solved.

Definitions and Acronyms

PCB. Printed Circuit Board.
COB. Chip-On-Board.
Flip-Chip is also known as controlled collapse chip connection. It is a method for interconnecting semiconductor devices to external circuitry with solder bumps that have been deposited onto the chip pads. In order to mount a chip to external circuitry such as a PCB, the chip is flipped over so that its top side faces down, and aligned so that connection pads align with matching pads on the PCB, and then the solder is reflowed to complete the interconnect.

Footprint refers to the area (or the border of that area) delimited by the orthogonal projection of a component on a surface which is generally plane.

LED. Light Emitting Diode or OLED (organic light emitting diode).

A Naked die is a chip without chip carrier or other electronics so that the naked die has to be connected to the conductors on a carrier substrate such as a PCB.

Flexible PCB may be designed to survive a 5 mm bending radius.

Offset OFF is an acceptable offset between the carrier substrate and a light emitting die in the z direction, i.e. the direction perpendicular to the carrier substrate.

DETAILED DESCRIPTION OF THE INVENTION

The present invention will be described with respect to particular embodiments but the invention is not limited thereto but only by the claims. Any reference signs in the claims shall not be construed as limiting the scope.

Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order, unless specified. It is to be understood that the terms so used are interchangeable under appropriate circumstances and that the embodiments of the invention described herein are capable of operation in other sequences than described or illustrated herein. The terms or definitions used herein are provided solely to aid in the understanding of the invention.

Embodiments of the present invention relate to displays having solid state light sources in the form of dies. An LED or OLED can include a number of layers, e.g. semiconductor layers and an active layer. Generally a solid state light source such as an LED or OLED will have two electrical contacts. An LED or OLED can include a substrate, a first semiconductor layer, an active layer, a second semiconductor layer, a reflector layer, a first electrode and a second electrode.

Figure 1:
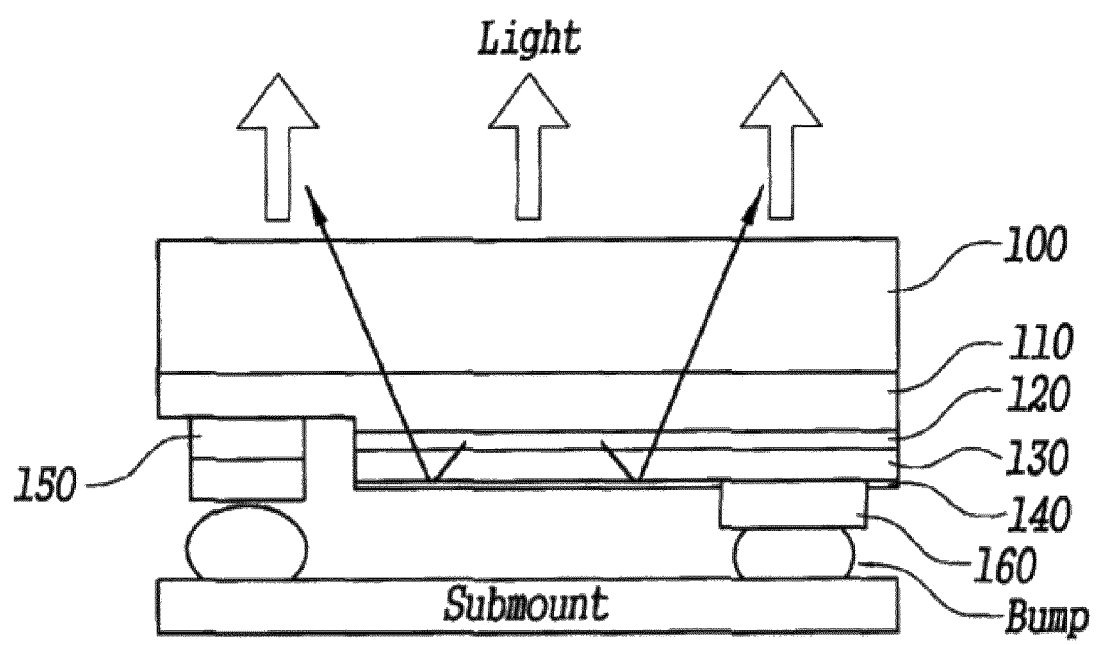
FIG. 1 shows an example of naked die LED that is connected to conductors on a carrier substrate according to the prior art.
Figure 2:
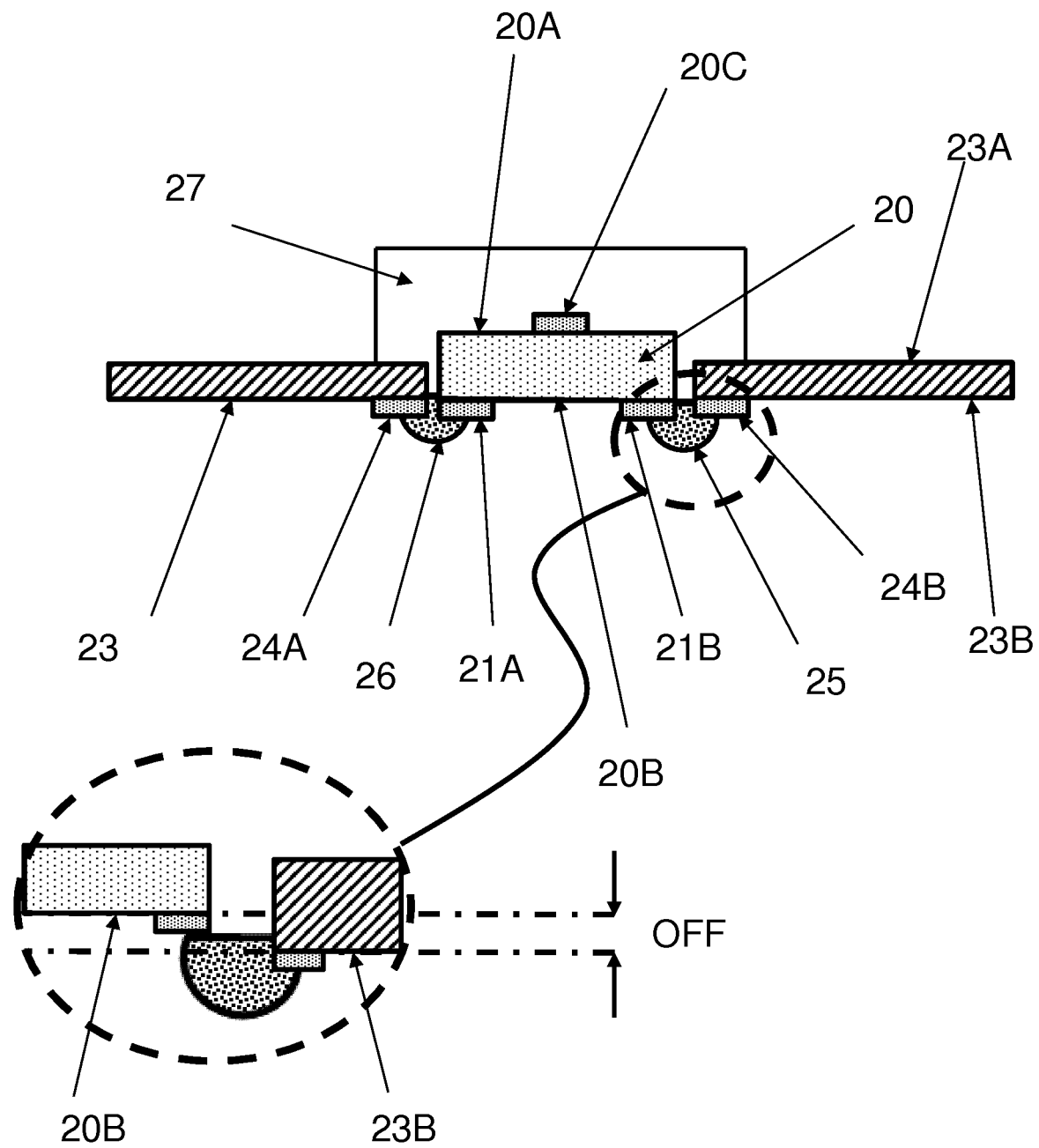
FIG. 2 shows an example of naked die LEDs connected to a printed circuit board and encapsulated according to the invention.

FIG. 2 shows a cross section of an example of a solid state die such as an LED (or OLED) die 20 connected to a carrier substrate 23 such as a printed circuit board and encapsulated on the carrier substrate 23 such as the printed circuit board according to embodiments of the present invention. A naked die 20 has a first main surface or side 20A and a second side or main surface 20B. A light emitting diode (or OLED) element 20C is positioned on the first main surface 20A. Contact elements 21A and 21B are positioned in or on the second main surface 20B of the naked die 20. For example, the contact elements 21A and 21B are electrically connected to an anode and a cathode of the light emitting diode (LED or OLED) element 20C. The anode and cathode are signal conductors and at least two or more signal conductors (e.g. anode and cathode) from a solid state light source such as an LED or OLED die are provided per hole or opening in the carrier substrate. This reduces the number of holes required by 50% compared to conventional through hole technology.

The naked die 20 fits in a through hole or opening 22 made in a carrier substrate 23 like for example, a printed circuit board. The carrier substrate 23 such as a printed circuit board can be flexible. The carrier substrate 23 has a first main surface or side 23A and a second side or main surface 23B.

The contacts 21A and 21B on the second main surface 20B of the naked die 20 are electrically connected to contacts 24A and 24B on the second main surface 23B of the carrier substrate 23 such as a printed circuit board, by means of a connector. The connector may be e.g. conductive adhesive beads 25 and 26. The second main surface 20B of the naked die 20 and the second main surface 23B of the carrier substrate 23 can be substantially flush or co-planar. There may be an offset such as a small offset OFF between the second main surface 20B and the second main surface 23B. The offset OFF can be caused by tolerances of e.g. the equipment used to position the die 20 into the opening 22. The offset OFF is preferably smaller than the thickness of the carrier substrate 23. The offset (OFF) may be provided (i.e. tolerated) between the fourth major surface and the second main surface. This offset OFF is preferably smaller than the thickness of the carrier substrate, preferably less than 30%, more preferably less than 10% of the thickness of the carrier substrate. The offset for example, can be at most 30% or more preferably at most 10%. In these case the offset has little effect. For example the offset can be at most 30 micron or more preferably at most 10 micron. For example the carrier substrate may be a PCB which may have a thickness between 0.1 and 10 mm.

The light emitting naked die 20 is then preferably encapsulated in an encapsulant e.g. a silicone or silicone based glue 27.

If the electrical connection between an electrode (like e.g. 21A) on the naked die 20 and an electrode (like e.g. 24A) on the carrier substrate 23 is damaged, repair is possible without having to remove the encapsulating material 27.

Figure 3:
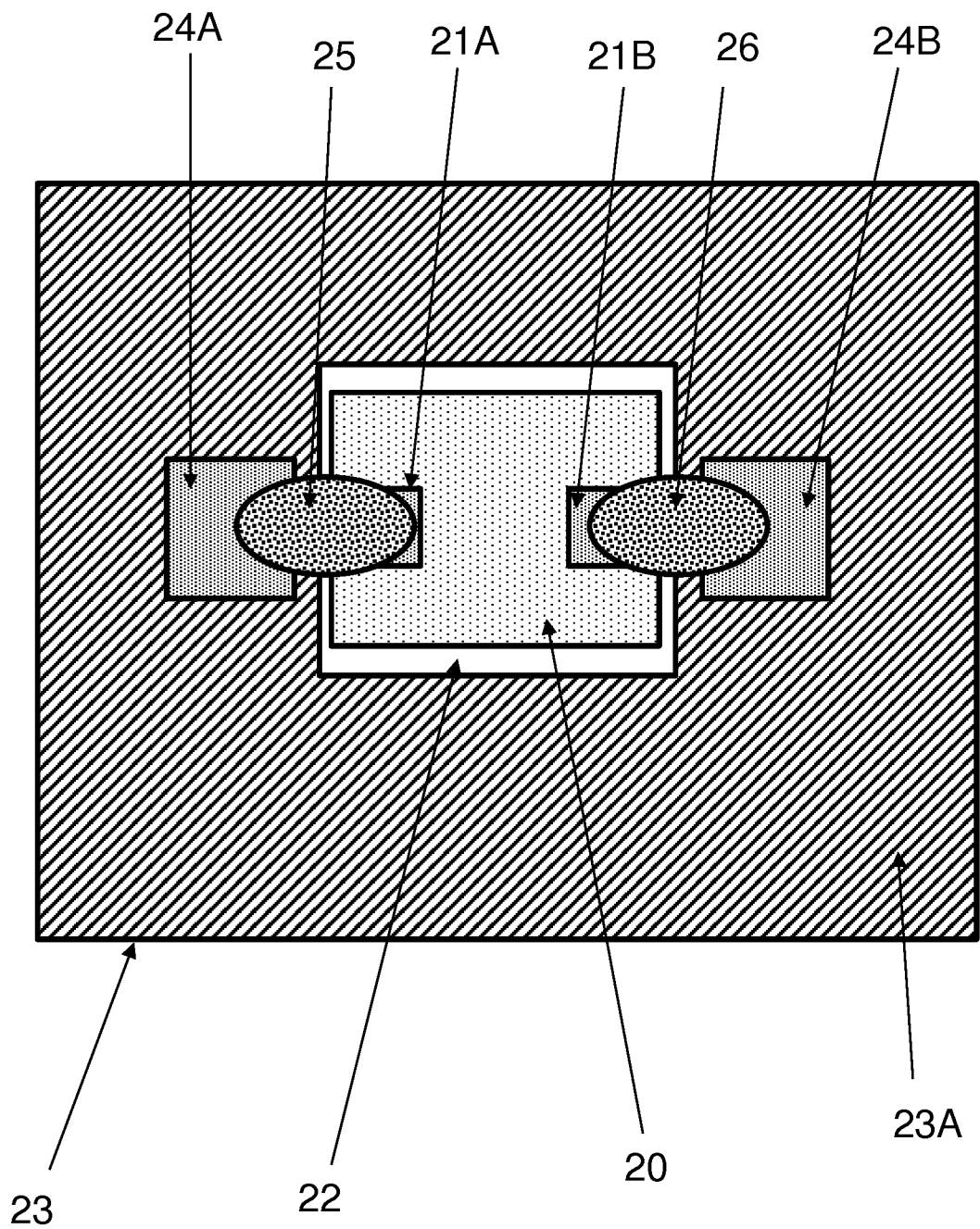
FIG. 3 shows how the naked die fits in an opening or through hole in the printed circuit board.

FIG. 3 shows a top view of a solid state die such as the LED (or OLED) 20 fitting in the opening 22 made in the carrier substrate 23 such as the printed circuit board.

Figure 4A:
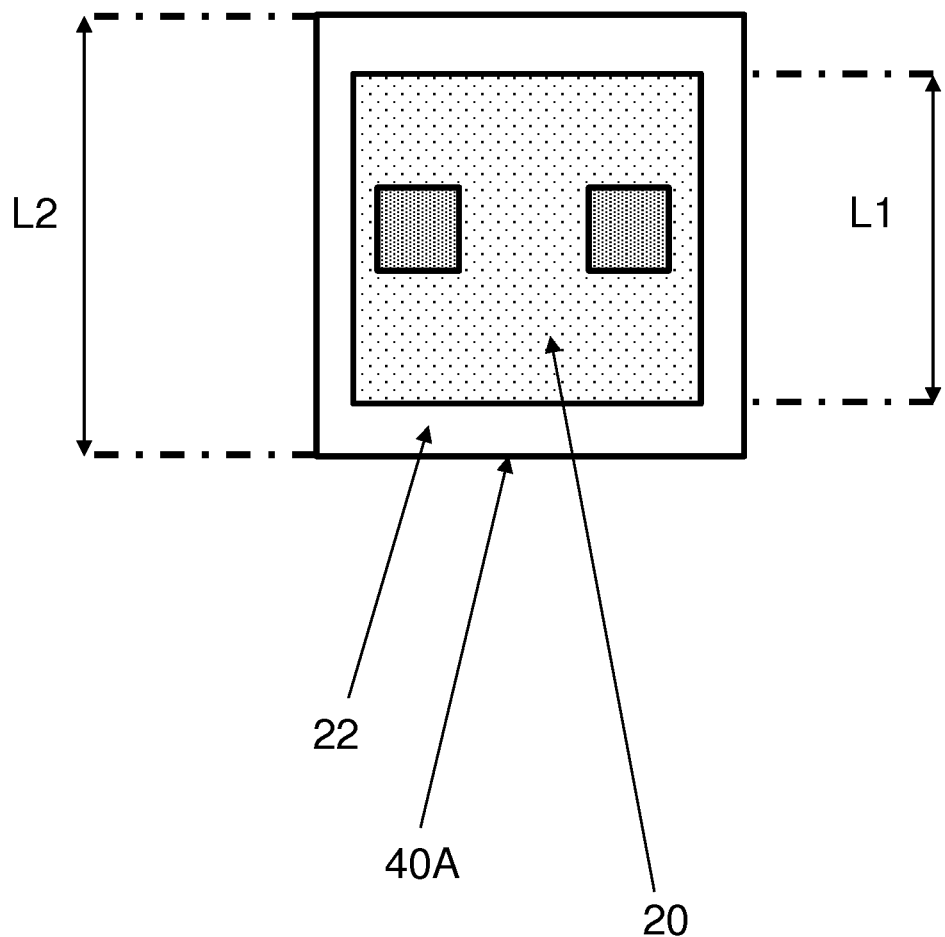
FIGS. 4A and 4B show example of footprints for the opening or through hole in the printed circuit board.
Figure 4B:
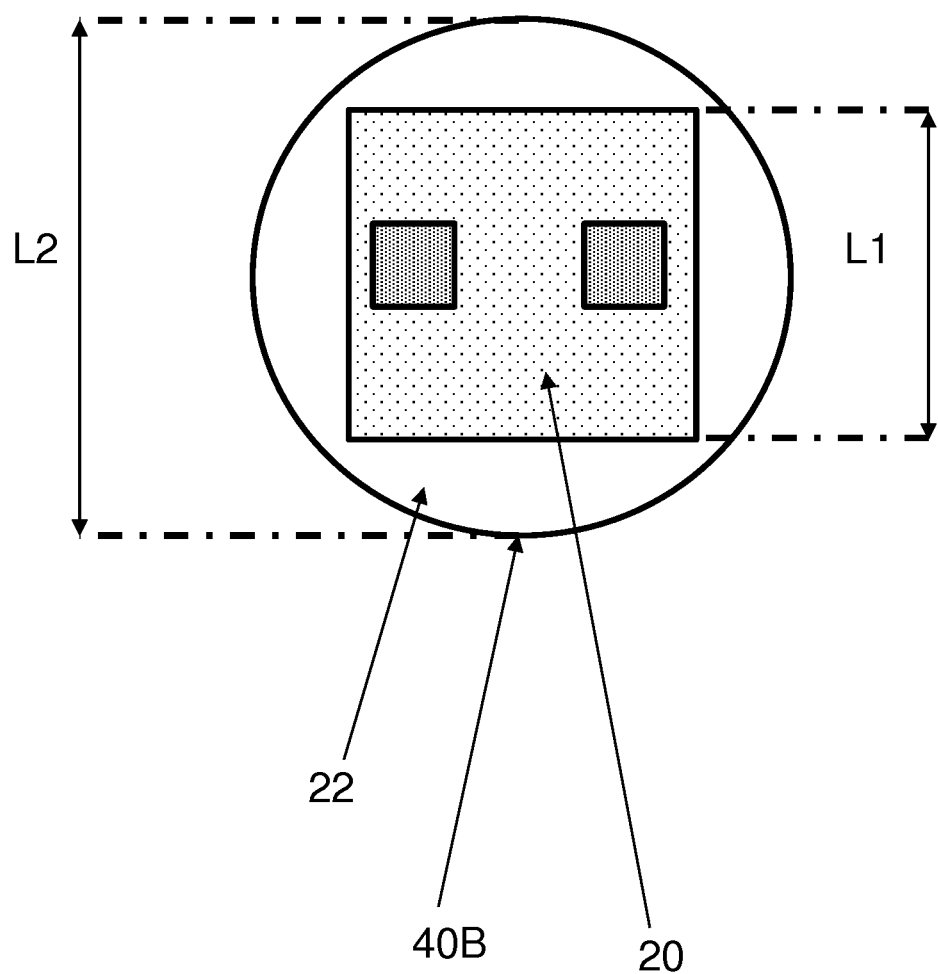

As illustrated on FIG. 4A, if the footprint of the light emitting die 20 is e.g. a square with a side of length L1, the opening 22 can be delimited by e.g. a square 40A with a side of length L2>L1. As illustrated on FIG. 4B, if the footprint of the light emitting die 20 is e.g. a square with a side of length L1, the opening 22 can be delimited by e.g. a circle 40B with a radius R>√2*L1 (L2 is 2R). More generally, the opening 22 has lateral dimensions (side of square, radius of a disk, width and length of a rectangle . . . ) larger than the lateral dimensions of the footprint of the light emitting die 20. The light emitting die 20 can then fit in, and can be taken up into the opening 22. Once inserted, the second surface 20B will be substantially co-planar with second surface 23B.

The difference in size between L2 and L1 or R (=L2/2) and L1 (i.e. in the x and y plane) is preferably larger than a tolerance ε that affects the alignment of the naked light emitting die 20 and the opening 22 in the z plane. Hence, this offset is preferably smaller than the thickness of the carrier substrate. The offset (OFF) may be provided (i.e. tolerated) between the fourth major surface and the second main surface. This offset OFF is preferably smaller than the thickness of the carrier substrate, preferably less than 30%, more preferably less than 10% of the thickness of the carrier substrate. The offset for example, can be at most 30% or more preferably at most 10%. In these case the offset has little effect. For example the offset can be at most 30 micron or more preferably at most 10 micron. For example the carrier substrate may be a PCB which may have a thickness between 0.1 and 10 mm.

A method to assemble a display with solid state light sources such as an LED (or OLED) display according to an embodiment of the present invention, will be described with reference to the drawings.

Figure 5:
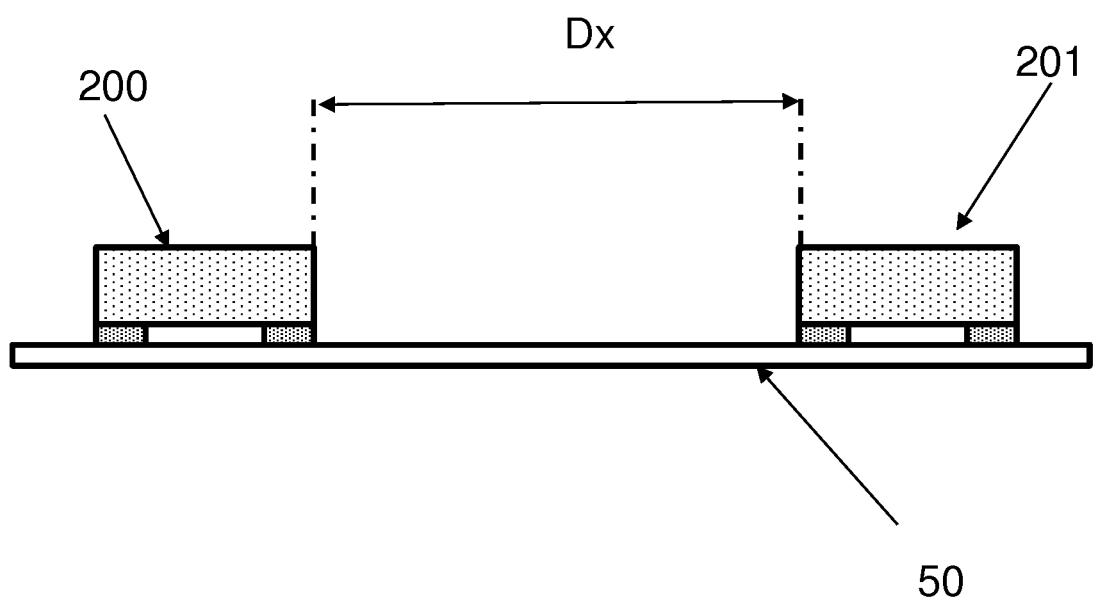
FIG. 5 is a cross section of an array of naked dies on a carrier substrate.
Figure 6:
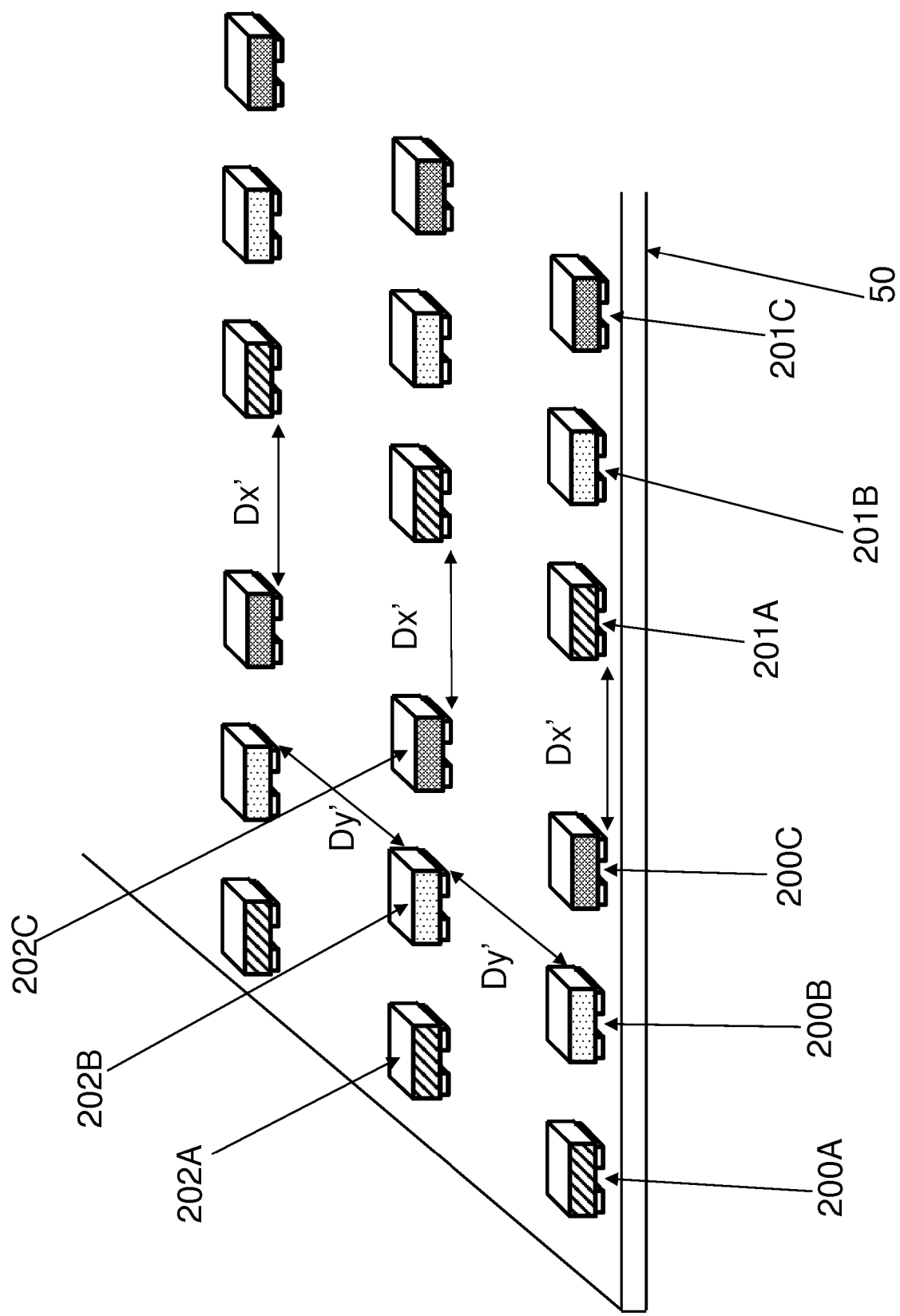
FIG. 6 is a perspective view of an array of naked dies on a carrier substrate

Light emitting naked dies 200, 201, . . . are pre-positioned on a carrier membrane 50 as illustrated on FIG. 5 and FIG. 6. The membrane 50 is used as a disposable tool for offering up and for allowing attaching of the naked dies to the carrier substrate 23. FIG. 5 illustrates a cross section through the carrier membrane 50 while FIG. 6 gives a perspective view of the light emitting naked dies distributed over the carrier membrane 50, e.g. in a periodical array. In FIG. 6, the solid state light sources can be LEDs (or OLED's) are shown as RGB triplets forming an array of regularly spaced RGB pixels. The carrier membrane 50 can be made of a plastic e.g. PVC, polyolefin, or polyethylene sheet or foil.

The carrier membrane 50 can for instance be a tape such as a dicing tape, a backing tape or a blue tape known from the art. The distances (Dx in FIG. 5 and Dx' and Dy' in FIG. 6) between adjacent light emitting dies can be the same distance between adjacent light emitting dies in a conventional LED (or OLED) display. Other configurations are included within the scope of the present invention.

For instance, the LEDs (or OLEDs) can be used to build a LED (or OLED) display and the LEDs (or OLEDs) can be clustered in groups of three or four of such LEDs (or OLEDs). Each LED (or OLED) of a cluster can correspond to a sub-pixel of a given primary color (e.g. RGB or RGBW with R=Red, G=Green, B=Blue and W=White).

FIG. 6 shows a perspective view of solid state light sources such as LEDs grouped in RGB triplets. A first triplet 200 comprises a red LED 200A, a green LED 200B and a blue LED 200C. A second triplet 201 comprises a red LED 201A, a green LED 201B and a blue LED 201C. The distance between the two adjacent triplets like e.g. a first triplet (200A, 200B, 200C) and a second triplet (201A, 201B, 201C) along a first direction is Dx'. The distance between two adjacent triplets like e.g. a first triplet (200A, 200B, 200C) and a third triplet (202A, 202B, 202C) along a second direction is Dy'.

Figure 8:
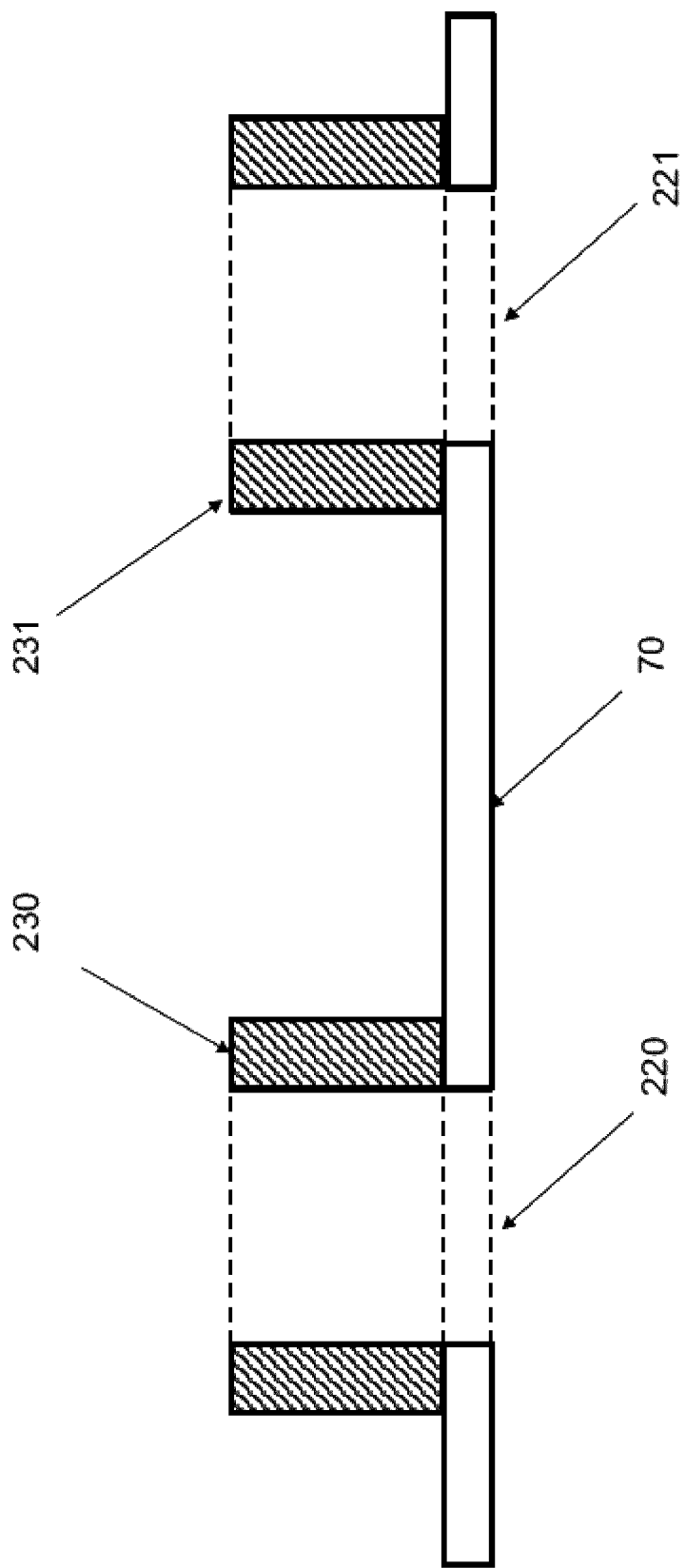
FIG. 8 shows a cross section of a printed circuit board with openings and the corresponding enclosures.

FIG. 8 shows openings 220, 221, . . . made in substrate such as a printed circuit board 70. These can be through holes. Conductive tracks and contact pads can be made on a back side. This is typically the case with a PCB. The printed circuit board 70 can be a flexible circuit board made of a material like polyimide, PEEK, polyester . . . .

The openings 220, 221, . . . can be formed by any suitable techniques such as those of subtractive machining, e.g. by punching, cutting, drilling or laser ablation or drilling. But the carrier substrate may also be moulded with holes therein.

Figure 7:
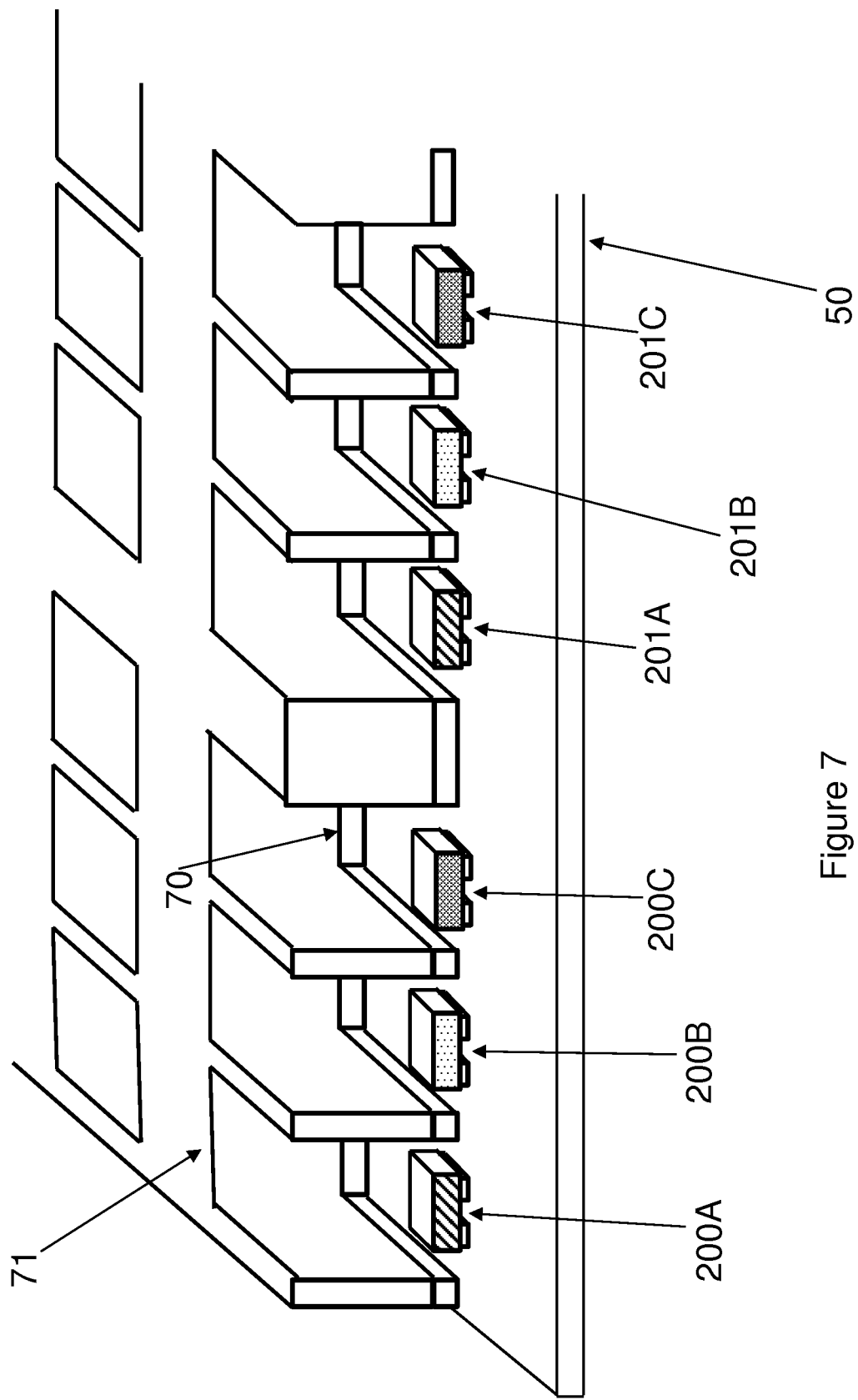
FIG. 7 shows a perspective view of a printed circuit board with openings and the corresponding enclosures according to the invention.

FIGS. 7 and/or 8 shows a cross section of the printed circuit board 70 with openings 220, 221 and the corresponding enclosures 230, 231. Enclosures 230, 231, . . . are formed or positioned around each of the holes or openings 220, 221, . . . . An enclosure 230, 231, . . . surrounds each hole or opening. The enclosures 230, 231 can be cylindrical and are open at both ends. For instance, the enclosures 230, 231 can have a circular cross section, a hexagonal cross section or a square cross section. If the enclosures 230, 231 have a circular cross section with an inner diameter DE and the openings 220, 221, . . . are delimited by a circle with a diameter DO, then DE is preferably larger than DO (DE>DO).

FIG. 7 shows a perspective view of the printed circuit board 70 with holes or openings 220, 221, 222, and the corresponding enclosures made in a thick layer or film 71 formed on the printed circuit board 70. The layer or film 71 may be 100 to 300 micron thick for example 200 micron thick.

The enclosures can, for example, be printed on the printed circuit board (e.g. inkjet printing or silk screen printing or any other form of 3D printing).

Alternatively, the enclosure can be drilled or punched in a thick film 71 which can be deposited on or fixed to the printed circuit board 70. In that case, the enclosures are formed at the same time as the openings in a self-aligning fashion as illustrated on FIG. 9A and FIG. 9B. The layer or film 71 may be 100 to 300 micron thick for example 200 micron thick. Layer or film 71 can be applied by roll lamination, roll to roll processing, squeegee coating, etc.

Figure 9A:
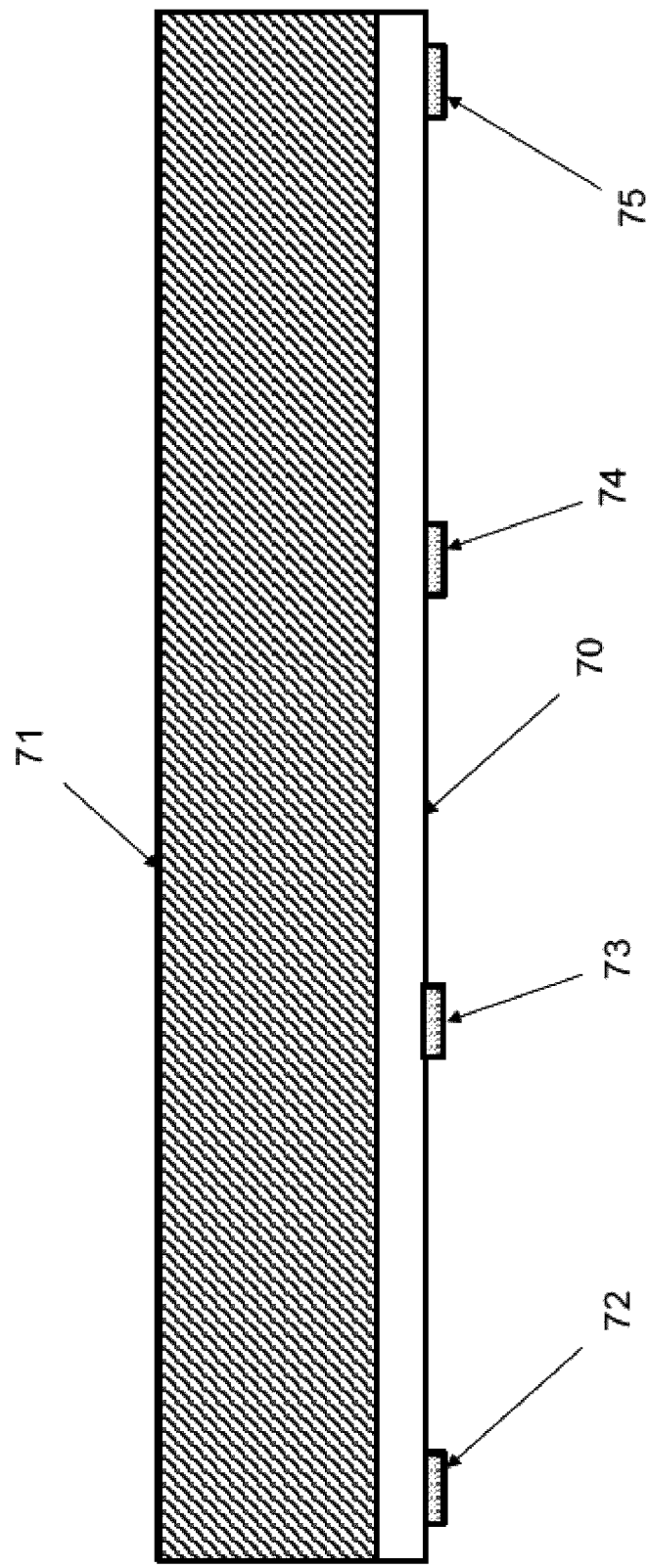
FIG. 9A shows a cross section of a printed circuit board topped by a film or layer used to form enclosures.

FIG. 9A shows a cross section of the printed circuit board 70 topped by a film or layer 71. Both the PCB 70 and layer 71 are fixed or fastened to each other. The layer 71 can e.g. be a resin that is cured after having been dispensed and spread on the printed circuit board 70, thereby adhering to the printed circuit board 70. The layer or film 71 may be 100 to 300 micron thick for example 200 micron thick. Layer or film 71 can be applied by roll lamination, roll to roll processing, squeegee coating, etc.

Figure 9B:
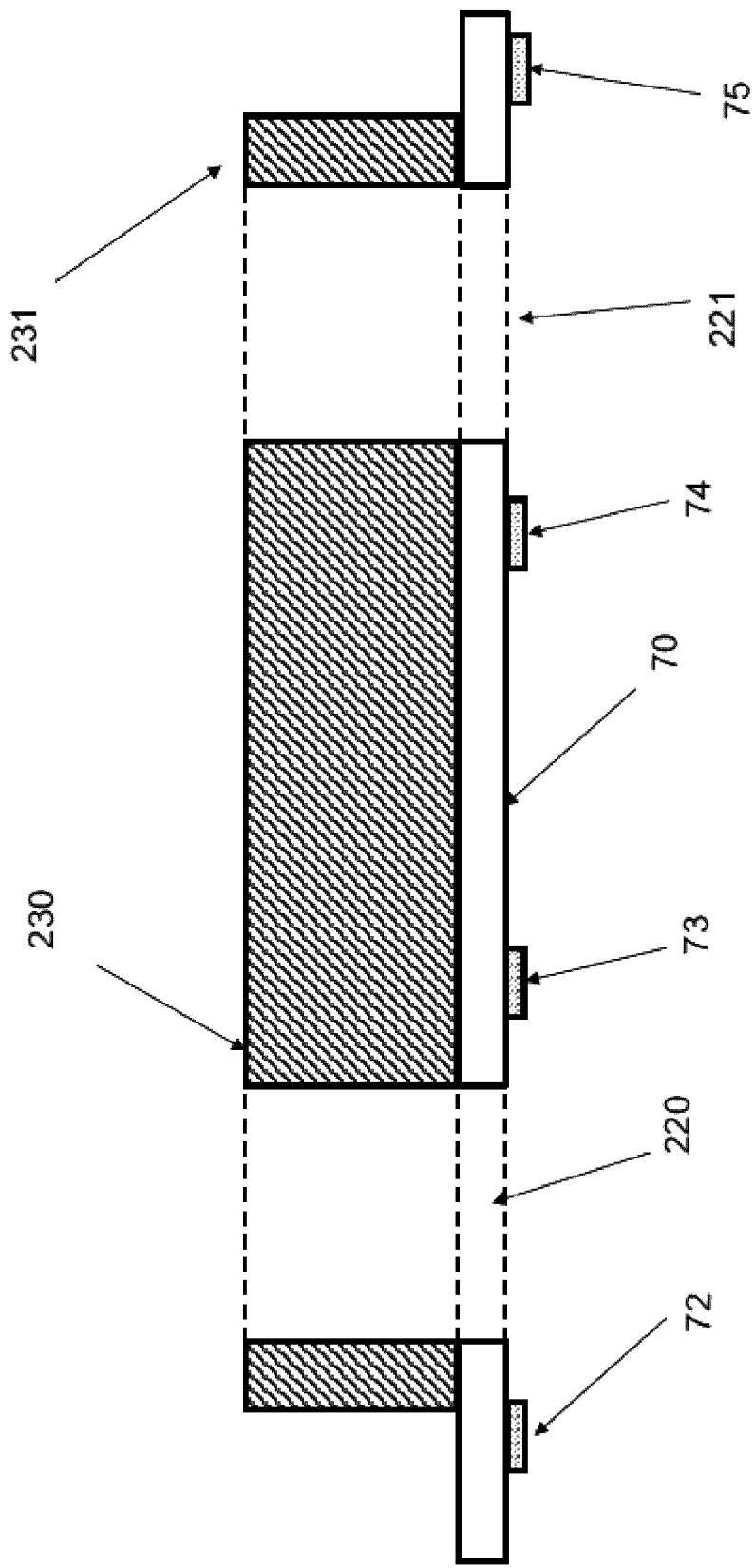
FIG. 9B shows a cross section of a printed circuit board topped by a film or layer once they have been punched or drilled to form openings for naked dies.

As shown in FIG. 9B holes 220, 221 are made in both the PCB 70 and layer 71 by a subtractive machining process, e.g. they are punched, ground, milled, laser oblated, drilled or laser drilled. They can be formed by subtractive machining e.g. punched, ground, milled, shaped, drilled or laser drilled or oblated at the same time. A cross section of the result can be seen on FIG. 9B. The enclosures can be connected with each other or be standalone.

The electrical contacts 72, 73, 74, 76 . . . on the printed circuit board 70 will be electrically connected to the contact pads of the solid state light sources such as LEDs (or OLEDS) on the naked dies which are on the side of the printed circuit board opposite to the side in contact with the layer 71.

When formed e.g. by printing on the printed circuit board 70, the enclosures 230, 231, . . . are distinct from each other as seen on FIGS. 7 and 8.

Figure 10:
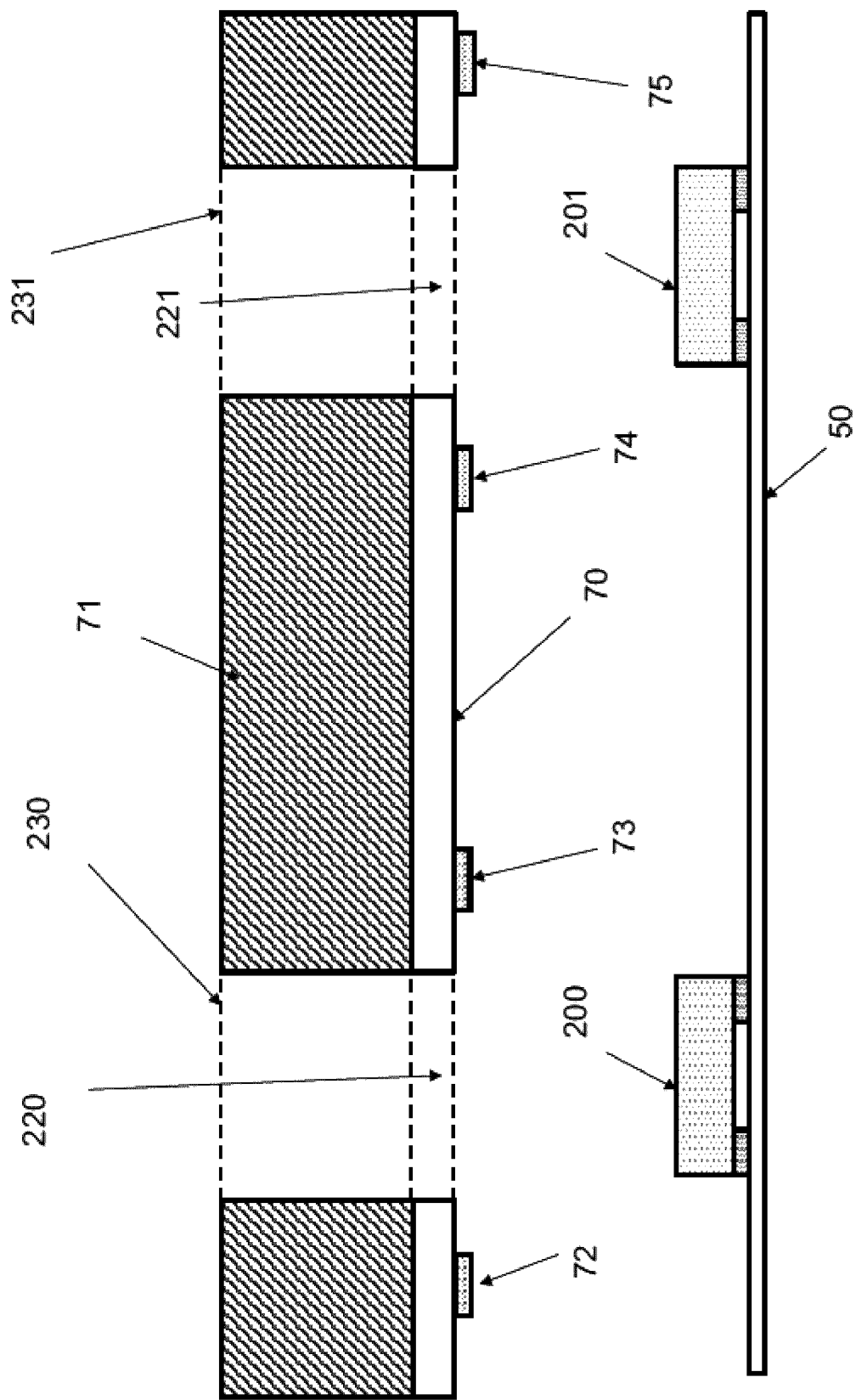
FIG. 10 shows a cross section of a carrier membrane with naked dies aligned with openings in the printed circuit board and the corresponding enclosures.

The openings or holes 220, 221, . . . form a lattice on the printed circuit board that has the same periodicity as the lattice formed by the naked dies on carrier 50 membrane. The openings or holes 220, 221, . . . in the printed circuit board 70 can be aligned with the light emitting naked dies 200 on the carrier membrane 50. This is illustrated on FIG. 10 which shows a cross section of both the carrier membrane 50 with light emitting naked dies 200, 201 . . . aligned with the openings 220, 221 in the printed circuit board 70 and the corresponding enclosures 230, 231 . . . made in the thick film 71 . . . . The layer or film 71 may be 100 to 300 micron thick for example 200 micron thick. This can be applied by roll lamination, roll to roll processing, squeegee coating, etc.

Figure 11:
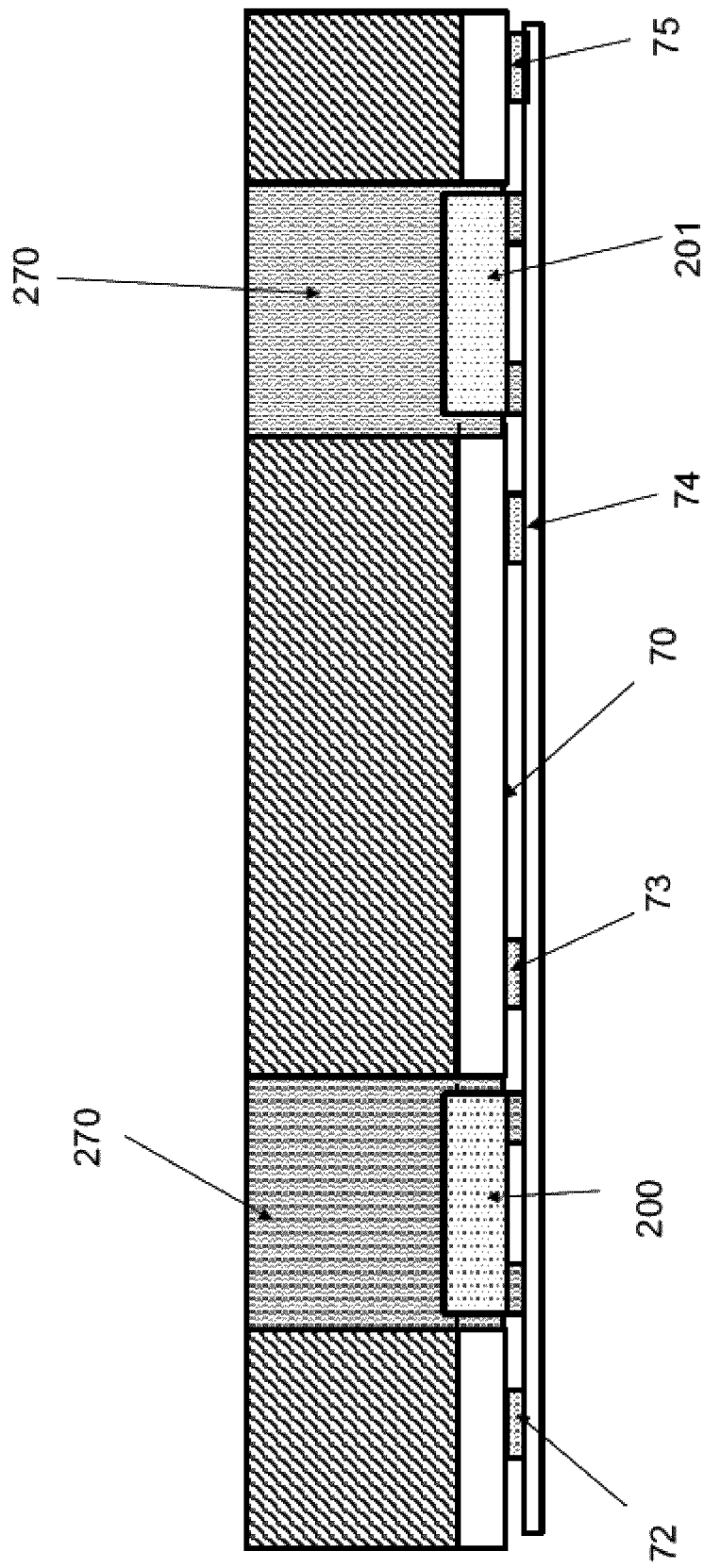
FIG. 11 shows a cross section of the naked dies fitting in the openings and the enclosure once encapsulating material has been dispensed in the enclosures.
Figure 12:
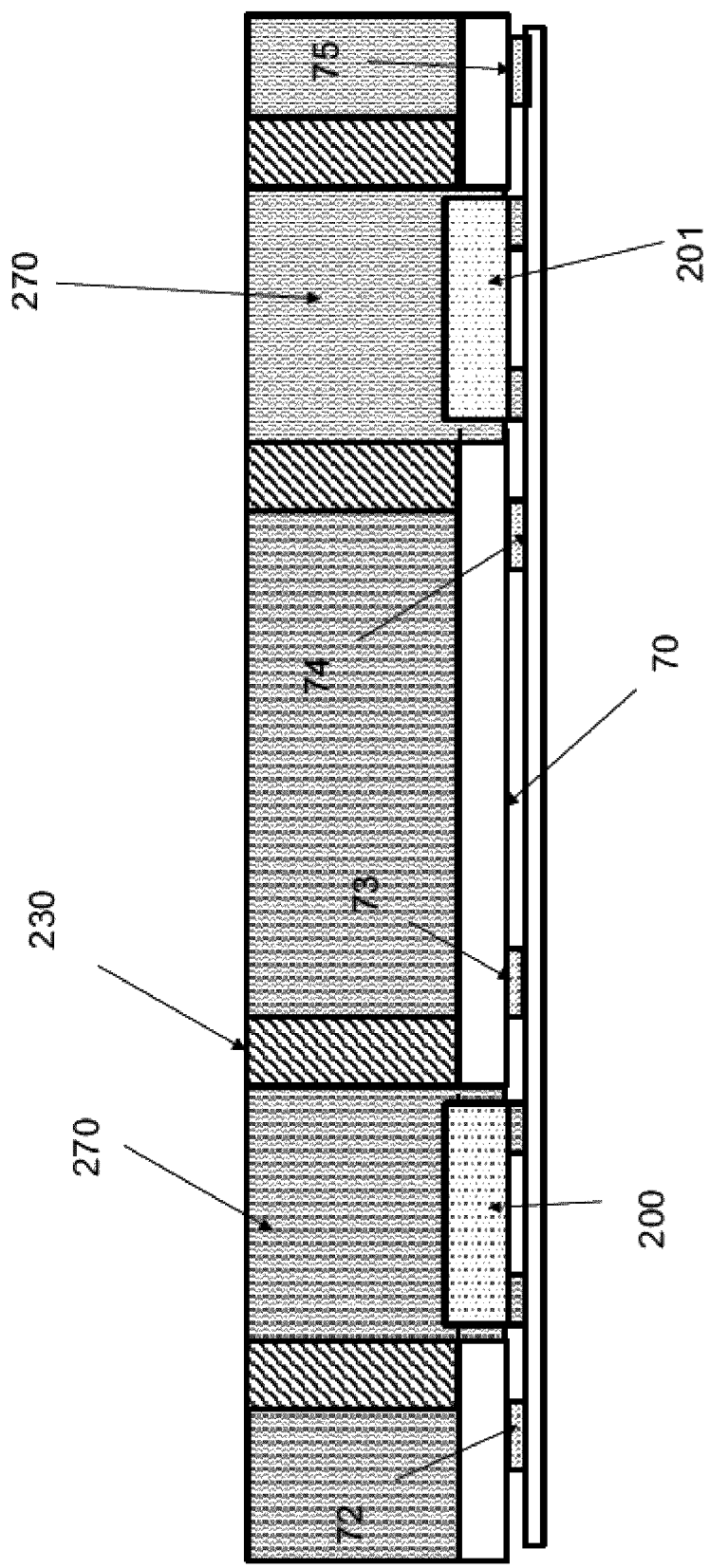
FIG. 12 shows a cross section of the naked dies fitting in the openings and the enclosure once encapsulating material has been dispensed in the enclosures and between enclosures.

When the light emitting naked dies 200, 201 . . . are positioned in the corresponding holes or openings 220 and 221 having enclosures 230, 231 . . . an encapsulating material 270 can be dispensed in the enclosures 230, 231 . . . . This is illustrated in FIG. 11. The enclosures need not be connected with each other (i.e. when they are individually printed instead of being punched in a thick film). The encapsulating material can also be dispensed around the enclosures 230, 231 . . . as well as in the enclosures 230, 231 . . . . This is illustrated in FIG. 12. The encapsulating material 270 can be e.g. cured or cross-linked. This can be by chemical crosslinking, room temperature vulcanizing, ebeam, UV or infrared crosslinking for example. For example, the encapsulating material can be silicone or silicone based glue.

Figure 13:
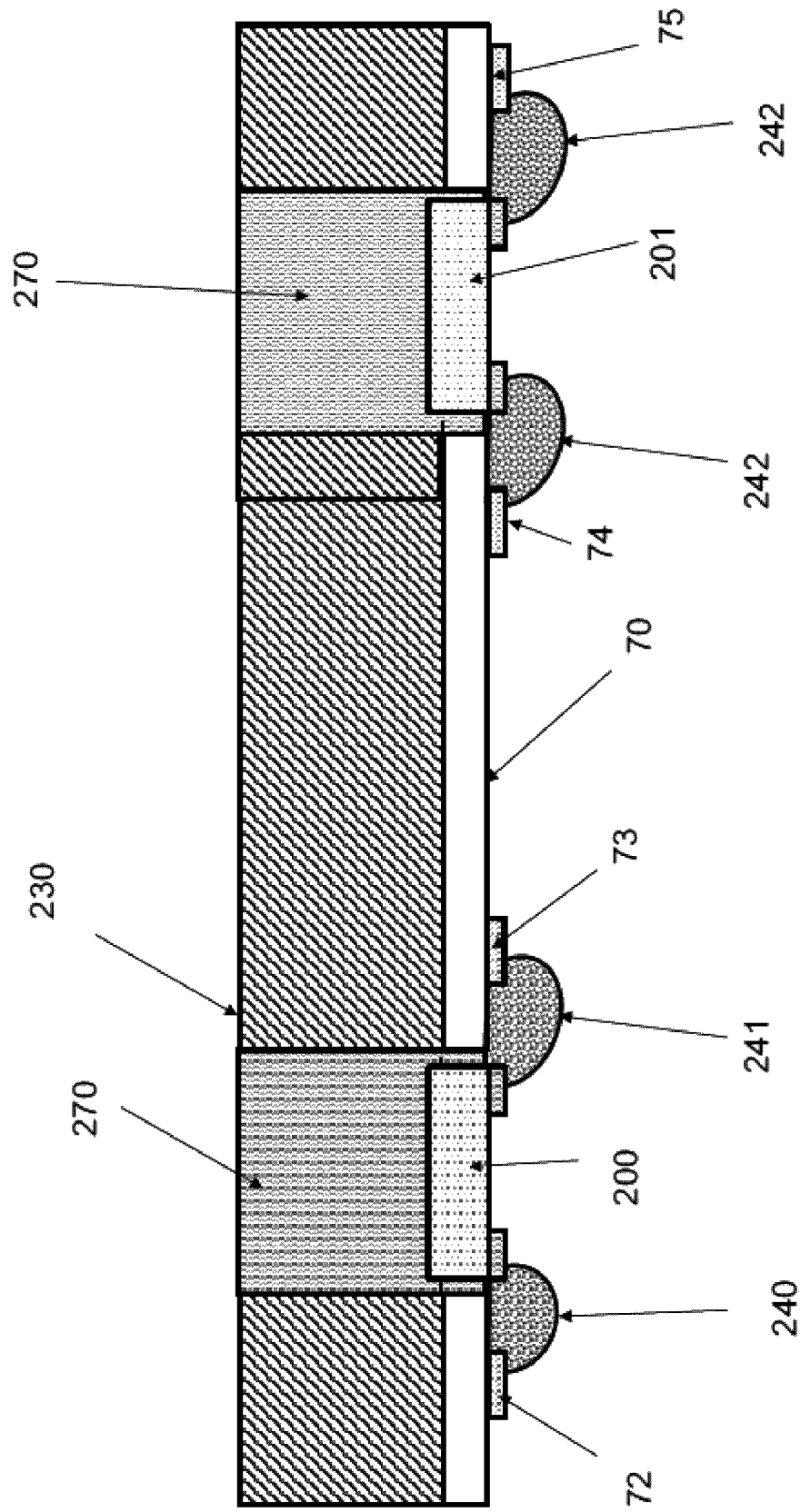
FIG. 13 shows a cross section of the naked dies fitting in the openings while allowing access to electrical contacts on the second surface of the naked dies and the electrical contact on the second surface of the printed circuit board.

The carrier membrane 50 is then removed (e.g. peeled off), thereby giving access to electrical contacts on the second surface of the naked dies 200, 201 and the electrical contacts on the second surface of the printed circuit board 70. Connections between the electrical contacts can be done e.g. by dispensing electrically conducting adhesive to make the connections. This is illustrated on FIG. 13. A first electrical contact is formed by an electrically conducting adhesive bead 240 between an electrode 72 on the printed circuit board and a first contact on the die 200. A second electrical contact is formed by an electrically conducting adhesive bead 241 between an electrode 73 on the printed circuit board and a second contact on the die 200 . . . .

The backside of the completed product according to any or all of the embodiments is preferably covered with an insulating layer applied over all of the contacts. This insulating layer may be an insulating adhesive tape for example or a coating of an insulting varnish or any other suitable insulating material. This may be done by spraying, for example.

While the invention has been described hereinabove with reference to specific embodiments, this was done to clarify and not to limit the invention. The skilled person will appreciate that various modifications and different combinations of disclosed features are possible without departing from the scope of the invention.

The invention claimed is:

1. A light emitting die connected to a carrier substrate, the light emitting die comprising:
   a light emitting element,
   wherein the light emitting die is located in a hole or opening made in the carrier substrate, the carrier substrate having a first major surface or side and a second major surface or side, the light emitting die having a third major surface or side and a fourth major surface or side, the light emitting element being positioned on the third major surface,
   wherein the fourth major surface of the light emitting die and the second major surface of the carrier substrate are arranged to be substantially flush or co-planar,
   first contact elements being positioned in or on the fourth major surface of the light emitting die, the first contact elements being electrically connected to an anode and a cathode of the light emitting element, respectively the first contact elements on the fourth major surface of the light emitting die having an electrical connection to second contact elements on the second major surface of the carrier substrate respectively by means of a conductive connection.

2. The light emitting die connected to a carrier substrate according to claim 1, wherein the light emitting die is encapsulated on the carrier substrate, or wherein the light emitting die is encapsulated on the carrier substrate with an encapsulant which is silicone or silicone based glue, or wherein the light emitting die is attached to removable foil or sheet.

3. The method of repairing the light emitting die connected to a carrier substrate according to claim 2, wherein when any of the first contact elements on the fourth major surface of the light emitting die which are electrically connected to second contact elements on the second major surface of the carrier substrate is damaged, a damaged connection is repaired without having to remove the encapsulating material.

4. The light emitting die connected to a carrier substrate according to claim 1, wherein the hole is a through hole.

5. The light emitting die connected to a carrier substrate according to claim 1, wherein the carrier substrate is a printed circuit board, or wherein the carrier substrate is flexible.

6. The light emitting die connected to a carrier substrate according to claim 1, wherein the electrical connection comprises conductive adhesive beads.

7. The light emitting die connected to a carrier substrate according to claim 1,
   wherein the fourth major surface of the light emitting die and the second major surface of the carrier substrate are offset between the fourth major surface and the second major surface, or
   wherein the fourth major surface of the light emitting die and the second major surface of the carrier substrate are offset by a distance smaller than 30% of a thickness of the carrier substrate.

8. The light emitting die connected to a carrier substrate according to claim 1, wherein an enclosure encloses the hole on three or four sides thereof, or
   wherein a layer is attached to the carrier substrate wherein an enclosure is formed in the layer, or
   further comprising an enclosure on the carrier substrate which encloses the hole, or
   further comprising an enclosure on the carrier substrate which encloses the hole on four sides thereof.

9. A method of connecting a light emitting die to a carrier substrate, the light emitting die having a light emitting element, the method comprising:
   locating the light emitting die in a hole or opening made in the carrier substrate, the carrier substrate having a first major surface or side and a second major surface or side, the light emitting die having a third major surface or side and a fourth major surface or side,
   arranging the fourth major surface of the light emitting die and the second major surface of the carrier substrate to be substantially flush or co-planar,
   positioning the light emitting element on the third major surface,
   positioning first contact elements in or on the fourth major surface of the light emitting die,
   electrically connecting the first contact elements to an anode and a cathode of the light emitting element respectively, and
   electrically connecting the first contact elements on the fourth major surface of the light emitting die to second contact elements on the second major surface of the carrier substrate respectively.

10. The method according to claim 9, comprising encapsulating the light emitting die on the carrier substrate, or comprising encapsulating the light emitting die on the carrier substrate with an encapsulant which is silicone or silicone based glue.

11. The method according to claim 9, wherein the hole is a through hole.

12. The method according to claim 9, wherein the carrier substrate is a printed circuit board, or wherein the carrier substrate is flexible.

13. The method according to claim 9, wherein the electrical connecting step comprises using conductive adhesive beads.

14. The method according to claim 9,
wherein the fourth major surface of the light emitting die and the second major surface of the carrier substrate are arranged to be substantially flush or co-planar with an offset between the fourth major surface and the second major surface.

15. The method according to claim 14, wherein the offset between the fourth major surface and the second major surface that is smaller than 30% of a thickness of the carrier substrate.

16. The method according to claim 9, further comprising forming an enclosure which encloses the hole.

17. The method according to claim 16, wherein the enclosure is formed self-aligning with the hole or opening.

18. The method according to claim 9, further comprising attaching a layer to the carrier substrate, the enclosure being formed in the layer.

19. The method according to claim 9, wherein locating the light emitting die in a hole or opening comprises attaching the light emitting die to a foil or sheet and inserting the light emitting die in the carrier substrate using the foil or sheet.

20. The method according to claim 19, further comprising removing the foil or sheet to expose the first and/or the second contact elements.

* * * * *